United States Patent
Takamatsu

(10) Patent No.: US 8,922,859 B2
(45) Date of Patent: Dec. 30, 2014

(54) LIGHT SOURCE DEVICE, METHOD OF ASSEMBLING LIGHT SOURCE DEVICE, OPTICAL SCANNING DEVICE, AND IMAGE FORMING APPARATUS

(75) Inventor: Shuji Takamatsu, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 314 days.

(21) Appl. No.: 13/605,843

(22) Filed: Sep. 6, 2012

(65) Prior Publication Data

US 2013/0063798 A1 Mar. 14, 2013

(30) Foreign Application Priority Data

Sep. 14, 2011 (JP) ................................ 2011-200208

(51) Int. Cl.
*G02B 26/08* (2006.01)
*G02B 26/12* (2006.01)
*H05K 3/34* (2006.01)
*H05K 3/30* (2006.01)

(52) U.S. Cl.
CPC .............. *G02B 26/12* (2013.01); *H05K 3/3447* (2013.01); *H05K 3/308* (2013.01); *H05K 2201/10878* (2013.01)
USPC .......... 359/198.1; 359/204.1; 29/838; 29/839

(58) Field of Classification Search
CPC ............ H05K 2201/10878; H05K 2201/2027; H05K 3/305; H05K 3/3447; G02B 26/10; G02B 26/12; G02B 26/123; G02B 6/009
USPC ............ 359/196.1–226.2; 347/225, 232–233, 347/243, 259–261
See application file for complete search history.

(56) References Cited

U.S. PATENT DOCUMENTS

| | | | |
|---|---|---|---|
| 2003/0103535 A1* | 6/2003 | Kasai | ............................... 372/36 |
| 2012/0182735 A1 | 7/2012 | Takamatsu et al. | |

FOREIGN PATENT DOCUMENTS

| | | |
|---|---|---|
| JP | 9-181396 | 7/1997 |
| JP | 10-107378 | 4/1998 |
| JP | 10-244707 | 9/1998 |
| JP | 2000-77792 | 3/2000 |
| JP | 2002-6248 | 1/2002 |
| JP | 2002-344060 | 11/2002 |
| JP | 2003-174293 | 6/2003 |
| JP | 2004-325922 | 11/2004 |
| JP | 2004-325929 | 11/2004 |
| JP | 2004 325930 | 11/2004 |
| JP | 2005-70495 | 3/2005 |
| JP | 2006-72136 | 3/2006 |

* cited by examiner

*Primary Examiner* — James Phan
(74) *Attorney, Agent, or Firm* — Cooper & Dunham LLP

(57) ABSTRACT

A method of assembling a light source comprises the steps of inserting multiple lead wires of a light emitting element into an insertion hole formed in a circuit board from one side of the circuit board at once, striking tips of the multiple lead wires with corresponding multiple guides formed on a circumference of a pressing device serving as a jig from the other side of the circuit board, moving the pressing device toward the one side from the other side of the circuit board, and in a first stage guiding the multiple lead wires to corresponding terminals formed in an inner wall of the insertion hole of the circuit board, respectively.

20 Claims, 12 Drawing Sheets

α AXIS DIRECTION

α AXIS DIRECTION

LIGHT SOURCE DEVICE, METHOD OF ASSEMBLING LIGHT SOURCE DEVICE, OPTICAL SCANNING DEVICE, AND IMAGE FORMING APPARATUS

CROSS-REFERENCE TO RELATED APPLICATION

This patent application is based on and claims priority pursuant to 35 U.S.C. §119 to Japanese Patent Application No. 2011-200208, filed on Sep. 14, 2011 in the Japan Patent Office, the entire disclosure of which is hereby incorporated by reference herein.

BACKGROUND OF THE INVENTION

1. Field of the Invention

This invention relates to a light source device, a method of assembling the light source device, an optical scanning device with the light source device, and an image forming apparatus with the optical scanning device, and in particular to a light source device having a light-emitting element and a circuit board, a method of assembling such a light source device, an optical scanning device provided with the light source device assembled by the method, and an image forming apparatus having the optical scanning device.

2. Description of the Background Art

In a light source device having a light-emitting element mounted on a circuit board, multiple lead wires of the light-emitting element are independently connected to multiple terminals provided on the circuit board, respectively, as described in Japanese Patent Application Publication Nos. 2006-72136 and 2005-70495 (JP-2006-72136-A and JP-2005-7045-A).

However, since the multiple lead wires are respectively guided and fixed (e.g., soldered) onto the corresponding terminals on the circuit board using a jig, such as a pair of tweezers, etc., when a conventional light source device is assembled, it was time consuming and workability is not good.

BRIEF SUMMARY OF THE INVENTION

Accordingly, the present invention provides a novel method of assembling a light source comprising the steps of inserting multiple lead wires of a light emitting element into an insertion hole formed in a circuit board from one side of the circuit board at once, striking tips of the multiple lead wires with corresponding multiple guides formed on a circumference of a pressing device serving as a jig from the other side of the circuit board, moving the pressing device toward the one side from the other side of the circuit board, and guiding the multiple lead wires in a first stage to corresponding terminals formed on an inner wall of the insertion hole of the circuit board, respectively.

In another aspect of the present invention, each of the multiple guides formed on the circumference of the pressing device has multiple first grooves increasingly approaching the inner wall of the insertion hole as extending toward the other side of the circuit board. Further, the step of guiding the multiple lead wires in the first stage is executed using the first groove.

In yet another aspect of the present invention, each of the multiple guides formed on the circumference of the pressing device has a second groove continuously extending from the other side end of the first groove in a direction that the insertion hole extends. Further, the steps of moving the pressing device in a second stage toward the one side from the other side of the circuit board after the first stage and guiding the multiple lead wires along the corresponding second grooves, respectively, in the second stage are included.

In yet another aspect of the present invention, a cross section of the pressing device perpendicular to a direction that the pressing device is inserted into the insertion hole is larger than the insertion hole.

In yet another aspect of the present invention, either the pressing device or the circuit board has a securing device to secure a pressing device to a circuit board. Further, the step of securing the pressing device to the circuit board using the securing device during the second stage is included.

In yet another aspect of the present invention, the pressing device is moved until the other side of the pressing device is located on the same plane as the other side of the circuit board during the second stage.

In yet another aspect of the present invention, the step of soldering the respective multiple lead wires and the corresponding terminals together after the second stage is included.

In yet another aspect of the present invention, the pressing device has insulation properties, and the grooves include conductive members having electrical conductivity. Further, the step of soldering the respective multiple lead wires, the corresponding terminals, and the conductive members together after the second stage is included.

In yet another aspect of the present invention, an optical scanning device includes the light source assembled by using the assembly method and an optical scanning unit that scans a scanning object with a light emitted from the light source.

In yet another aspect of the present invention, an image forming apparatus includes an image bearer and the optical scanning unit that scans the image bearer with a light.

BRIEF DESCRIPTION OF THE DRAWINGS

A more complete appreciation of the present invention and many of the attendant advantages thereof will be more readily obtained as the same becomes better understood by reference to the following detailed description when considered in connection with the accompanying drawings, wherein.

DETAILED DESCRIPTION OF THE INVENTION

Figure 1:
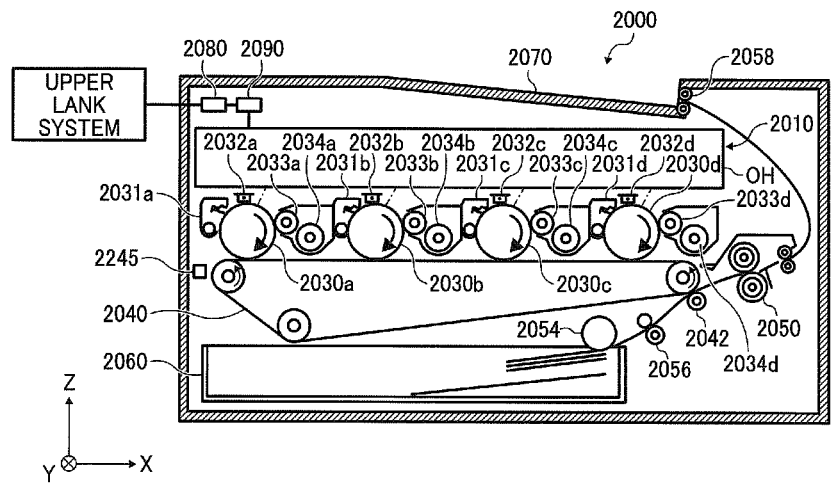
FIG. 1 is a schematic diagram illustrating a color printer according to one embodiment of the present invention.

Referring now to the drawings, wherein like reference numerals designate identical or corresponding parts throughout the several views thereof and in particular to FIG. 1, a schematic configuration of a color printer 2000 according to a first embodiment of an image forming apparatus is described.

The color printer 2000 is a tandem type multicolor color printer that forms a full color image by superimposing images of four colors (black, cyan, magenta, and yellow) on top of each other. The color printer 2000 includes an optical scanner 2010, four photoconductive drums (2030a, 2030b, 2030c, and 2030d), and four cleaning units (2031a, 2031b, 2031c, and 2031d). The color printer 2000 also includes four discharge devices (2032a, 2032b, 2032c, and 2032d), four developer rollers (2033a, 2033b, 2033c, and 2033d), and four toner cartridges (2034a, 2034b, 2034c, 2034d). Further included are a transfer belt 2040, a transfer roller 2042, and a fixing roller 2050. Yet further included are a sheet feed roller 2054, a pair of pre-transfer rollers 2056, and a sheet exit roller 2058. Further included are a sheet feed tray 2060, a sheet exit tray 2070, and a communication control device 2080. A printer control unit 2090 is also included the color printer 2000 to control each of the above-described devices.

The communication control device 2080 controls bi-directional communications with an upstream device (e.g., a personal computer) through the network.

The photoconductive drum 2030a, the charging device 2032a, the developing roller 2033a, the toner cartridge, and the cleaning unit 2031a are used in a unit and constitute an image forming station forming a black image.

The photoconductive drum 2030b, the discharge device 2032b, the developer roller 2033b, the toner cartridge 2034b, and the cleaning unit 2031b are used in combination, and together constitute an image forming station forming a cyan image.

The photoconductive drum 2030c, the discharge device 2032c, the developer roller 2033c, the toner cartridge 2034c, and the cleaning unit 2031c are used in combination, and together constitute an image forming station forming a magenta image.

The photoconductive drum 2030d, the discharge device 2032d, the developer roller 2033, the toner cartridge 2034d, and the cleaning unit 2031d are used in combination, and together constitute an image forming station forming a yellow image.

A photosensitive layer is formed on a surface of each of the photoconductive drums. That is, each surface of the photoconductive drum serves as a light scanning target. Here, it is premised that each photoconductive drum is rotated by a rotation mechanism, not shown, in a direction shown by an arrow in FIG. 1.

Hereinafter, it is premised that an X-axis indicates a direction of arrangement of four photoconductive drums, and a Y-axis indicates a longitudinal direction of each photoconductive drum in a XYZ-three dimensional rectangular coordinate system.

Each charging device uniformly charges the surface of the photosensitive drum.

The optical scanning device 2010 emits a light flux modulated based on multi-color image data (e.g. black image data, cyan image data, magenta image data, and yellow image data) sent from the upstream device onto the surface of each thus-charged photoconductive drum corresponding thereto per color. An electric charge disappears from only a surface of the photoconductive drum receiving the light and so forms a latent image on the surface corresponding to the image data. The latent image subsequently moves toward a corresponding developer roller as the photoconductive drum rotates. The configuration of the optical scanning device 2010 is described later in more detail.

The toner cartridge 2034a contains black toner to be supplied to the developer roller 2033a. The toner cartridge 2034b contains cyan toner to be supplied to the developer roller 2033b. The toner cartridge 2034c contains magenta toner to be supplied to the developer roller 2033c. The toner cartridge 2034d contains yellow toner to be supplied to the developer roller 2033d.

Toner is applied from the corresponding toner cartridge onto a surface of each developer roller and forms a thin and even coat thereon as the developer roller rotates. When it contacts the surface of a corresponding photoconductive drum, the toner on the surface of each developer roller only partially moves and sticks to the surface thereof receiving the light flux. That is, each developer roller causes the toner to adhere to the latent image formed on the surface of the photosensitive drum and renders it visible. The image with toner adhered thereto (i.e., a toner image) moves toward the transfer belt 2040 as the photoconductive drum rotates.

Each of the toner images of yellow, magenta, cyan, and black is transcribed sequentially onto a transfer belt 2040 at a predetermined time and is superimposed thereon thereby forming a color image.

A sheet feed tray 2060 contains recording sheets. A sheet feeding roller 2054 is located adjacent to the sheet feed tray 2060. A sheet feeding roller 2054 extracts and transports the recording sheets one by one from the sheet feed tray 2060 to a pair of pre-transfer rollers 2056. The pair of pre-transfer rollers 2056 transfers the recording sheet toward a gap between a transfer belt 2040 and a transfer roller 2042 at a predetermined time. Hence, a color image on the transfer belt 2040 is transferred onto the recording sheet. The recording sheet with the transcribed color image is subsequently sent to the fixing roller 2050.

In the fixing roller 2050, heat and pressure are provided to the recording sheet, so that toner is fused on the recording sheet. The recording sheet with the fixed color image here is sent to a sheet exit tray 2070 via a sheet exit roller 2058, and is sequentially stacked on a sheet exit tray 2070.

Each cleaning unit removes the residual toner remaining on the surface of the photosensitive drum therefrom. The surface of the photoconductive drum from which residual toner has been removed returns to a position facing the discharge device again.

Now, a configuration of the optical scanning device 2010 is described with reference to mainly FIGS. 2 and 3.

The optical scanning device 2010 is almost entirely installed in an optical housing OH consisting of a box like member made of rigid plastic or the like arranged above the four photoconductive drums 2030a to 2030d.

Figure 2:
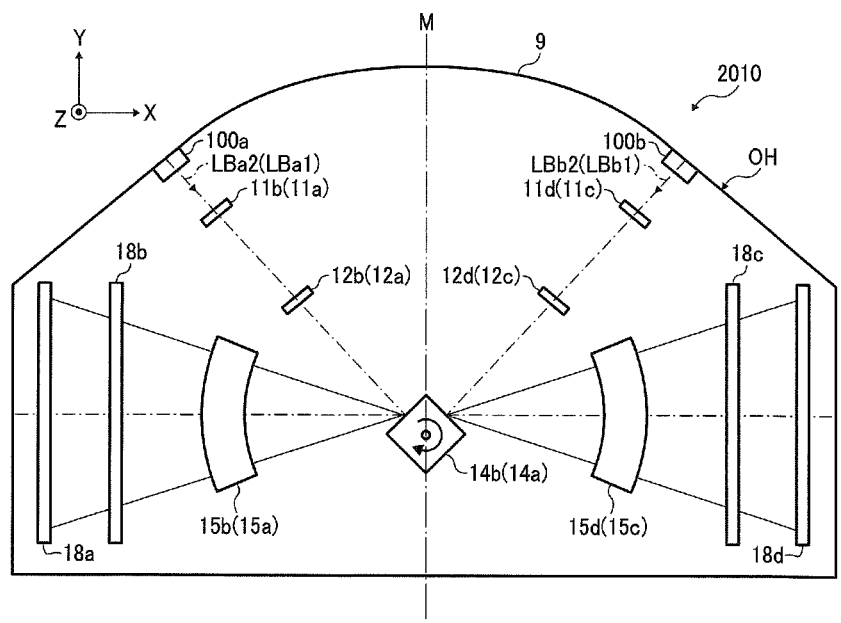
FIG. 2 is a diagram illustrating an optical scanning device shown in FIG. 1.
Figure 3:
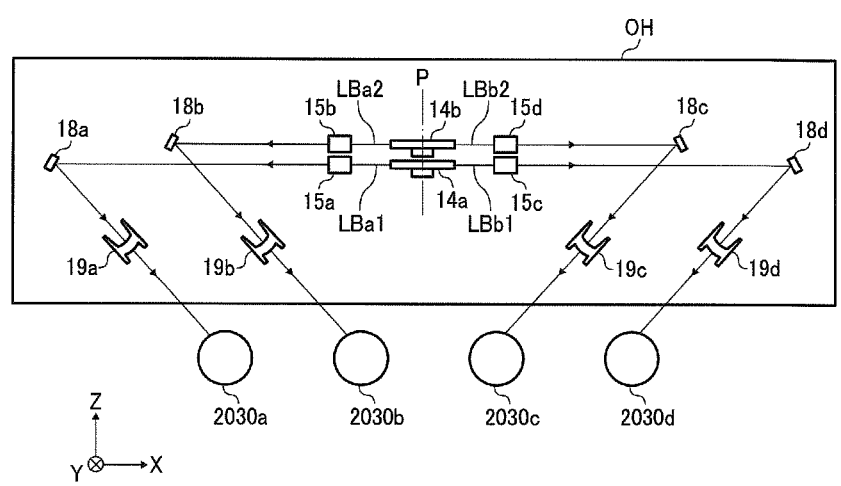
FIG. 3 is another diagram illustrating the optical scanning device shown in FIG. 1.

As shown in FIGS. 2 and 3 as one example, the optical scanning device 2010 includes two light sources (100a, 100b), four collimating lens (11a, 11b, 11c, and 11d), four cylindrical lenses (12a, 12b, 12c, and 12d), two polygon mirrors (14a, 14b), four f-θ lenses (15a, 15b, 15c, and 15d), four folding mirrors (18a, 18b, 18c, and 18d), four anamorphic lenses (19a, 19b, 19c, and 19d), and a scanning control device, not shown.

Hereinafter, for the sake of convenience, a direction corresponding to main scanning is simply referred to as a main scanning direction, and a direction corresponding to sub-scanning is simply referred to as a sub-scanning direction.

As shown in FIG. 2 as one example, the pair of light sources 100a and 100b is attached to a wall 9 of the optical housing OH horizontally spaced to each other. These two light sources 100a and 100b are placed in parallel to a Y-Z plane and are symmetrical about a plane M separating the optical housing OH into two. However, since those devices have virtually identical configurations except for arrangement as described above, only the light source 100a is typically described herein below.

Figure 4A:
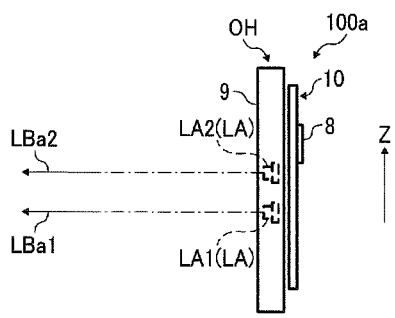
FIGS. 4A to 4C are diagrams collectively illustrating the light source shown in FIG. 2.

As shown in FIG. 4A, the light source device 100a may include more than two (for example two) one-dimensional laser arrays LA1 and LA2 as a light source and a circuit board 10 having a driving circuit 8 to drive these one-dimensional laser arrays LA1 and LA2. Since those arrays have virtually the identical configuration, these one-dimensional laser arrays LA1 and LA2 are collectively called a one-dimensional laser array LA when not needed to distinguish these arrays hereinafter.

Figure 4B:
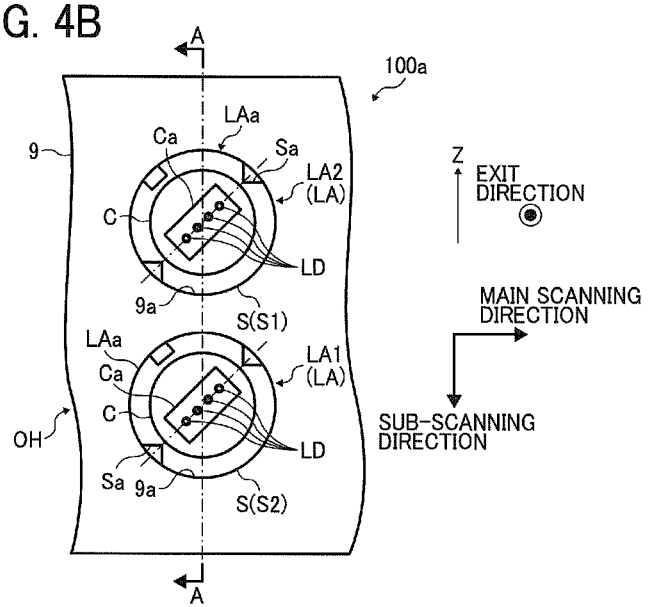
Figure 6A:
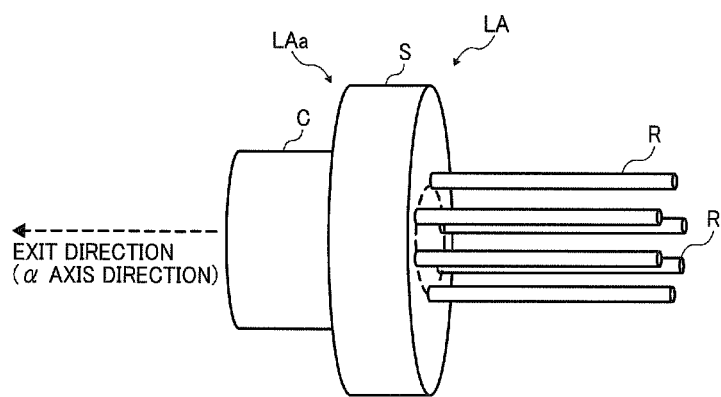
FIG. 6A is a perspective view illustrating a one-dimensional laser array included in the light source.

As shown in FIGS. 4B and 6A, the one-dimensional laser LA includes four laser diodes LD (e.g., an end surface light emitting laser), a photo diode LD (see FIG. 4C) to monitor optical outputs of the four laser diodes LD, multiple (e.g., six) lead wires R, and a main body LAa that holds the six lead wires R and the four laser diodes LD.

As shown in FIG. 6A, the main body LAa has a stepped cylinder outline shape as a whole as one example. Specifically, the main body LAa includes a stem S having almost a cylindrical shape in its large diameter section, and a cap C having almost a hollow cylindrical shape in its small-diameter section. The cap C is coaxially fixed onto one of bottoms of the stem S. The cap C of the stem S is made of metal, such as brass, etc.

The four laser diodes LD and the photodiode PD are attached to one of the bottoms of the stem S covered by the cap being insulated from atmosphere. Further, some inert gas, such as nitrogen, etc., is filled inside the cap C.

As shown in FIG. 4B, to emit respective light fluxes in parallel to an axis of the main body LAa from the four laser diodes LD (each direction of a light flux becomes parallel), these four laser diodes LD are arranged side by side at a predetermined interval (e.g., with the same space) in a direction perpendicular to the axis of the main body LAa.

The main body LAa of the respective one-dimensional laser arrays LA1 and LA2 are attached to the sidewall 9 of the optical housing OH being arranged side by side in a Z-axis direction, so that light fluxes are parallel to each other as described later in detail. However, the one-dimensional laser array LA1 is located on the −Z side of the one-dimensional laser array LA2 (i.e., a reverse direction to the direction Z (hereinafter the same).

A position of each body LAa has been adjusted around its axis on the sidewall 9 of the optical housing OH so that the four laser diodes LD line up in a direction thereon making a prescribed angle in both main and sub-scanning directions, respectively. Specifically, an interval between neighboring two of the four laser diodes LD has a predetermined amount in the sub-scanning direction.

Such positioning is executed when the body LAa is attached to the sidewall 9, by locating two notches Sa, formed on an outer periphery of the stem S on a linear line where the four laser diodes LD line up, at prescribed sections.

On a lid of the cap C, an ejection window Ca made of transparent or translucent glass is provided. The respective four laser light fluxes emitted from the four laser diodes from their one side ends are taken out to an outside via the ejection window Ca.

Further, the four-laser light fluxes emitted from the four laser diodes from other ends (opposed to their one side ends) are received by the photodiode PD to be monitored.

Further, as shown in FIG. 6A, each of the six lead wires R is flexible having a circular cross section having a diameter of about 0.5 mm, for example, and is made of metal or the like. One side of each lead wire R is inserted into the cap C through a penetration hole (not shown) formed in the stem S, while the other side thereof protrudes from the other of the bottoms of the stem S.

Figure 4C:
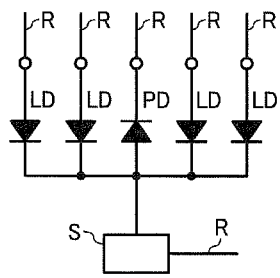

Further, as shown back in FIG. 4C, four one sides among six of those of the lead wires R inserted into the cap C are separately connected to four anodes of the laser diodes, respectively. Remaining one is connected to a cathode of the photo diode PD, and yet remaining one is connected to the stem S. Further, the respective cathodes of the four laser diode LD and the anode of the photodiode PD are connected to the stem S. Hence, the four laser diodes LD and the photodiode PD are connected in a reverse polarity relation.

The other side of each of the six lead wires R protruding from the other one of bottoms of the stem S is electrically connected to a corresponding terminal provided on the circuit board 10 as described later more in detailed. Specifically, each one-dimensional laser array LA is mounted on the circuit board 10.

That is, four lead wires R among six are used to supply current to the laser diodes LD. The remaining one is used to detect a light outputted from the photodiode PD. The rest of the above wires R is grounding use.

Further, light output control (i.e., Auto Power Control: APC) and modulation control of the four laser diodes LD are executed by the above-described scanner control device based on a monitor current flown in the photodiode PD via the driving circuit 8 provided in the circuit board 10.

Further, the circuit board 10 is installed in the optical housing OH as described later in detailed. The circuit board 10 employs a stiff and rigid board made of epoxy or the like. However, a flexible substrate made of polyimide or similar material, or a rigid flexible substrate combining the stiff-rigid and flexible members can also be adopted.

As shown in FIG. 2, a light flux LBa1 having four laser-beams emitted from the one-dimensional laser arrays LA1 being spaced in the sub-direction and a light flux LBa2 having four laser-beams emitted from the one-dimensional laser arrays LA2 being spaced in the sub-direction are ejected being spaced from each other in the Z axis direction. For example, the light flux LBa1 is located on the −Z side while the light flux LBa2 is located on the +Z side.

Similarly, a light flux LBb1 having four laser-beams spaced in the sub-scanning direction and a light flux LBb2 having four laser-beams spaced in the sub-direction are ejected being spaced from each other in the Z axis direction. For example, the light flux LBb1 is located on the −Z side and the light flux LBb2 is located on the +Z side.

Further, a pair of collimating lenses 11a and 11b are separately placed on respective optical paths of the light fluxes LBa1 and LBa2 emitted from the light source device 100a to cause the two light fluxes LBa1 and LBa2 to be substantially parallel optical light beams.

Further, two cylindrical lenses 12a and 12b are separately placed on the respective optical paths of the light fluxes LBa1 and LBa2 after the respective collimating lens 11a and 11b. Similarly, two cylindrical lens 12c and 12d are separately placed on respective optical paths of the light fluxes LBb1 and LBb2 passing through the collimating lenses 11c and 11d.

These two cylindrical lens 12a and 12c focus these two-light fluxes LBa1 and LBb1 passing through the respective collimating lenses 11a and 11c and execute imaging thereof near a reflective surface of a polygon mirror 14a in the Z axis direction. Similarly, the other two cylindrical lenses 12d and 12d focus these two-light fluxes LBa2 and LBb2 passing through the respective collimating lenses 11b and 11d and execute imaging thereof near a reflective surface of a polygon mirror 14b in the Z axis direction.

As shown in FIG. 3, these two polygon mirrors 14a and 14b are placed side by side and up and down such that the polygon mirror 14a is located on the +Z side and the polygon 14b miller on the −X side, respectively. Each of the two polygon mirrors 14a and 14b has a six-sided mirror serving as a mirror reflector as one example. These two polygon millers 14a and 14b rotate around respective their axes parallel to the X axis at the constant velocity, and deflect the light fluxes (LBa1, LBb1, LBa2, and LBb2) on planes orthogonal to the Z axis at the constant angular speed.

For example, the light fluxes LBa1 and LBa2 enter the reflection surfaces located on the −X side of the rotary axes of the polygon mirrors 14a and 14b, respectively. Similarly, the light fluxes LBb1 and LBb2 enter the reflection surfaces located on the +X side of the rotary axes of the polygon mirrors 14a and 14b, respectively.

Further, the light fluxes LBa1 and LBa2 are deflected to the −X side of the polygon mirrors 14a and 14b, respectively. Contrary, the light fluxes LBb1 and LBb2 are deflected to the +X side of the polygon mirrors 14a and 14b, respectively.

Further, a pair of f-θ (f-theta) lenses 15a and 15b are arranged on the −X side of the pair of polygon mirrors 14 a and 14b on the light paths of the light fluxes LBa1 and LBa2 deflected by the pair of polygon mirrors 14a and 14b, respectively. Contrary, a pair of f-θ lenses 15c and 15d are arranged on the +X side of the pair of polygon mirrors 14 a and 14b on the light paths of the light fluxes LBb1 and LBb2 deflected by the pair of polygon mirrors 14a and 14b, respectively.

Further, four returning mirrors 18a to 18d are placed separately on the respective light paths of the light fluxes LBa1, LBa2, LBb1, and LBb2 passing through the four f-θ lenses 15a to 15d to respectively bend the optical paths of the light fluxes LBa1, LBa2, LBb1, and LBb2 toward the photoconductive drums 2030a to 2030d.

Further, four anamorphic lenses 19a to 19d are located on the respective light paths of the light fluxes LBa1, LBa2, LBb1, and LBb2 passing through the four returning mirrors 18a to 18d, respectively.

These four light fluxes LBa1, LBa2, LBb1, and LBb2 passing through the four anamorphic lenses 19a to 19d are emitted to the surfaces of the photoconductive drums 2030a to 2030d, respectively. Thus, on the respective surfaces of the photoconductive drums, four light spots are formed with a space therebetween in a rotational direction. These four light spots move in a longitudinal direction of the photoconductive drum along with rotation of two polygon mirrors 14a and 14b. Specifically, the four light spots traverse (i.e., scan) each of the photoconductive drums. A direction that the light spot moves defines the main scanning direction in each of the photoconductive drums. A rotation direction of each photoconductive drum defines the sub-scanning direction in each of the photoconductive drums. Thus, writing of four lines simultaneously occurs on the scanning plane of each photoconductive drum.

Figure 5:
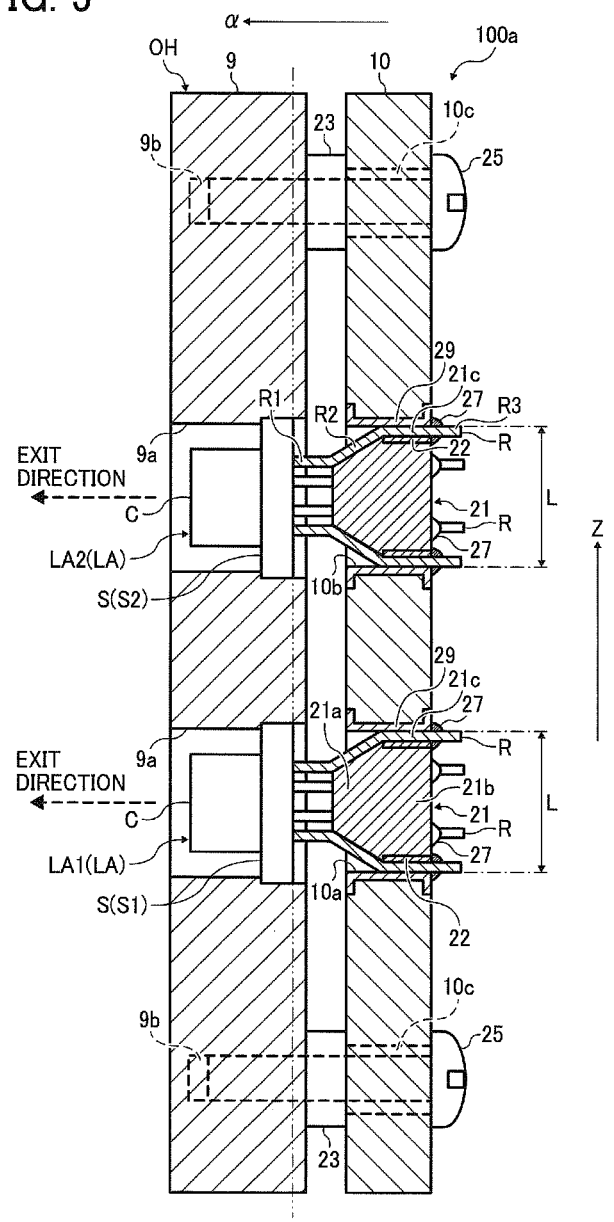
FIG. 5 is a cross-sectional view of the light source along a line A-A in FIG. 4B.
Figure 6B:
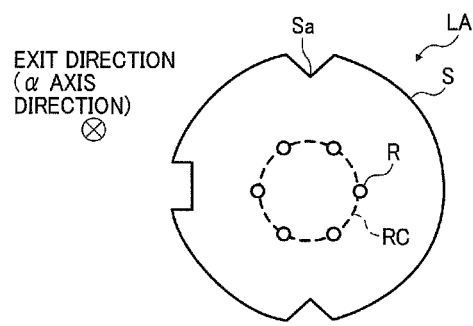
FIG. 6B is a rear view of the one-dimensional laser array.

Herein below, the light source device 100a is described more in detail. In FIG. 5, an aspect of a pair of one-dimensional laser arrays LA and the circuit board 10 when attached to the optical housing OH is illustrated with a sectional view. FIGS. 6A and 6B illustrate perspective rear views of the pair of one-dimensional laser arrays LA and the circuit board 10 before attachment thereof to the optical housing OH. Here, the other one of bottoms of the stem S of the one-dimensional laser array LA (i.e., a bottom surface from which the six lead wires R protrude) is simply referred to as a stem surface for the purpose convenience. Further, the stem S of the one-dimensional laser array LA1 is referred to as a stem S1, and the stem S of the one-dimensional laser LA2, a stem S2, respectively.

Further, as shown in the FIG. 5, the light source device 100a includes the pair of one-dimensional laser arrays LA, the circuit board 10, and lead wire guide members 21 (e.g., a pressing member) used as a jig to mount the one-dimensional laser arrays LA, respectively, onto the circuit boards 10.

Here, a pair of openings 9a each having a step are separately formed in the Z-axis direction on a sidewall 9 of the optical housing OH. The stepped opening 9a is constituted by two round holes having different diameters with a common axis for example. As shown, the cap C of the one-dimensional laser array LA1 is inserted in a smaller opening in the lower side stepped opening 9a. Whereas in a larger opening, the stem S of the one-dimensional laser array LA1 is inserted with pressure. Similarly, the cap C of the one-dimensional laser array LA2 is inserted in a smaller opening in the upper side stepped opening 9a. Whereas in a larger opening, the stem S of the one-dimensional laser array LA2 is inserted with pressure.

Specifically, each of the two stems S is pressed against the step of the stepped opening 9a so that the axis of the stem S matches a direction of a depth of the stepped opening 9a (i.e., the axis of the stem S matches with a centerline of the stepped opening 9a) and the stem surfaces are located on the same plane together. Further, each of these two stems S is positioned with a prescribed rotation angle around its axis regarding the optical housing OH. Hereinafter, a plane (see two-dot chain lines in FIG. 5) containing the stem surfaces of the stems S1 and S2 is simply referred to as a stem plane.

Specifically, the two one-dimensional laser arrays LA are integral via the optical housing OH (i.e., integrally held by the optical housing OH) with their light ejection positions coinciding with each other (i.e., exit surfaces are located on the same plane), and a pitch between the four laser diodes LD being appropriately adjusted in the sub-scanning direction. Herein below, these two one-dimensional laser arrays LA1 and LA2 are collectively referred to as a pair of laser arrays LAT. Further, the light emitting direction of each of the two one-dimensional laser arrays LA is referred to as a α-axis direction (i.e., a positive direction).

Before each of the six lead wires R of the one-dimensional laser array LA is connected to the circuit board 10, the other side end thereof (i.e., the section protruding from the stem plane toward the −α side) almost perpendicularly extends from the stem plane of the stem S as shown in FIG. 6A. A length of each of the other sides of the six lead wires R is the same to each other, here. However, the length is not necessarily the same.

Further, as one example, the six lead wires R of the one-dimensional laser array LA are located at the same interval along a circumferential surface of a virtual cylindrical column coaxial with the stem S as shown in FIG. 6B. Specifically, the six lead wires R are placed on a circle when viewed from a direction perpendicular to the stem surface, and more specifically, these are placed on apexes of a hexagon inscribed in the circle. Hereinafter, the circle where the six lead wires R are placed is simply referred to as a lead wire circle RC. A radius of the lead wire circle RC is, for example, from about 2 mm to about 3 mm. A diameter of the stem S may be from about 5 mm to about 6 mm.

Back to FIG. 5, the circuit board 10 may mainly consist of a rectangular plate (see FIG. 9B) and is fixed to the wall 9 of the optical housing OH being closely opposed to a wall surface on the −α side.

At a middle section of the circuit board 10 in the Z axis direction, a lead wire insertion hole 10a, into which the six pieces of lead wires R of the one-dimensional laser array LA1 are inserted in a block, and a lead wire insertion hole 10b, into which the six pieces of lead wires R of the one-dimensional laser array LA2 are inserted in a block, are formed with a space in the Z axis direction (e.g., the lead wire insertion hole 10a is located on the +Z side, while the lead wire insertion hole 10b is located on the −Z side).

As one example, the lead wire insertion hole 10a is an penetration circular opening (e.g., a round hole) extending in parallel to the α-axis, and is formed at a position corresponding to the stepped opening 9a on the −Z side (i.e., coaxial with the stepped opening 9a on the −Z side). Similarly, the lead wire insertion hole 10b may be a penetration circular opening (e.g., a round hole) extending in parallel to the α-axis, and is formed at a position corresponding to the stepped opening 9a on the +Z side (i.e., coaxial with the stepped opening 9a on the +Z side). Each of diameters of the lead wire insertion holes 10a and 10b is sufficiently larger than the diameter of the lead wire circle RC (e.g., from about 1.5 times to about 2.5 times).

At an inner surface of each of the lead wire insertion holes 10a and 10b, six terminals (electrodes) 29 each having an almost U-shaped cross section made of conductive material (e.g., metal) are attached at respective positions corresponding to the six lead wires R to almost pinch the circuit board 10. Specifically, the six terminals 29 are located on the vertexes of a hexagon inscribed in each of the lead wire holes 10a and 10b. For example, each terminal 29 is connected to the driving circuit 8 mounted on the circuit board 10.

Figure 9A:
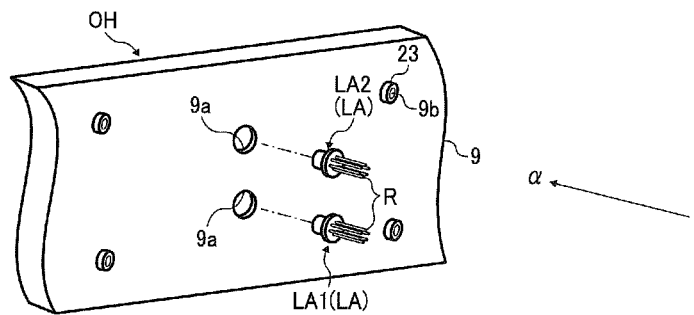
FIGS. 9A to 9C are diagrams collectively illustrating a process of assembling the light source device.
Figure 9B:
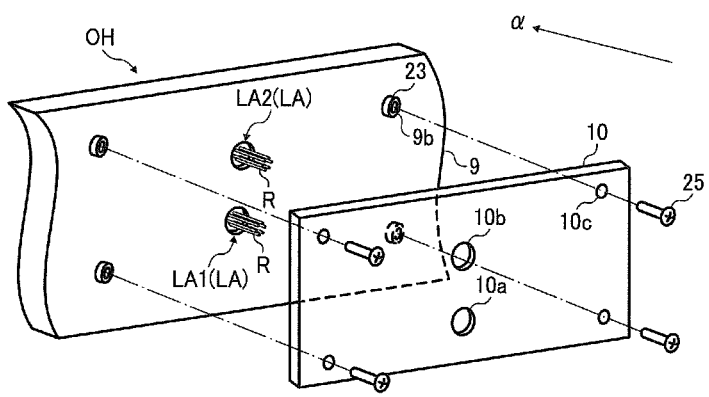

Further, at each of four corners of the circuit board 10, a bolt penetration hole 10c is formed into which a bolt 25 is inserted (see FIG. 9B).

By contrast, at sections on the sidewall 9 of the optical housing OH corresponding to the four corners of the circuit board 10 (i.e., the four bolt extrapolation holes 10c), female screw holes 9b engaging with the bolts 25 are formed (see FIG. 9A). Further, on sections of the optical housing OH, where the female screw holes 9b engages with the bolts 25, annular convex sections 23 coaxially protrude therefrom with the female screw holes 9b, so that the bolts 25 inserted into the bolt insertion holes 10c are inserted, respectively.

Specifically, the circuit board 10 is fixed to the optical housing OH through the four bolts 25 while engaging the four convex portions 23 formed on the optical housing OH.

Figure 7A:
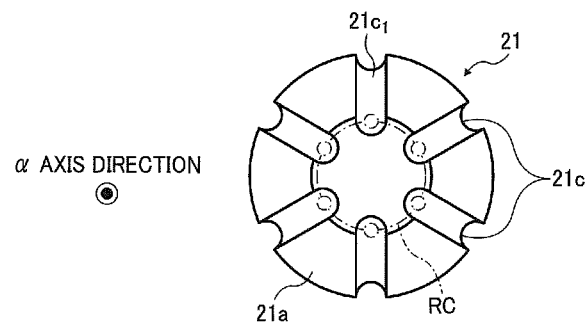
FIG. 7A is a front side view of the lead wire guide member provided in the light source device.
Figure 7B:
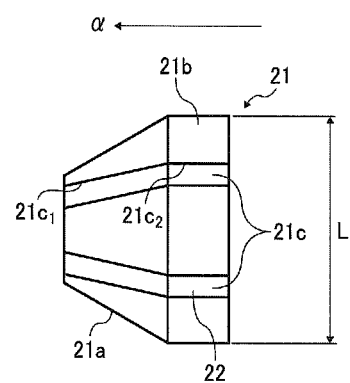
FIG. 7B is a side view of the lead wire guide member.

As shown in FIG. 7B, the lead wire guide 21 includes a tapered portion 21a almost formed from a circular truncated cone and a cylinder portion 21b coaxially integral with the tapered portion 21 at its maximum diameter site. Thus, the diameter of the cylindrical portion 21b is the same as the maximum diameter of the tapered portion 21a. The lead wire guide member 21 may be made of insulating material, such as epoxy, etc.

Figure 7C:
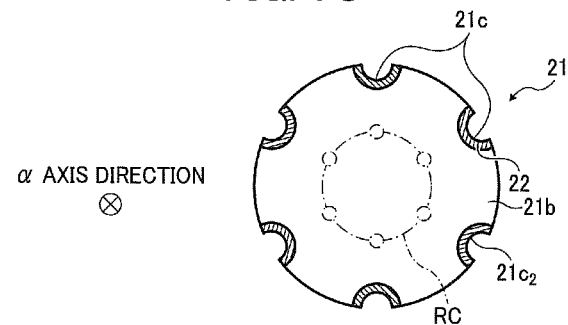
FIG. 7C is a rear view of the lead wire guide member.

As shown in FIGS. 7A to 7C, six guide grooves 21c are formed on the outer circumferential surface of the lead wire guide member 21 to guide the six lead wires R of each one-dimensional laser array LA toward a corresponding terminal 29 when a light source device 100a is assembled.

As can be understood from FIG. 7A, the six guide grooves 21c equivalently extend in six radial directions along an outer circumference of the tapered portion 21a from a minimum diameter side (i.e., on the +Alpha side) of the tapered portion 21a. Further, as also seen from FIGS. 7B and 7C, the six guide grooves 21c stretch parallel to the axis of the cylindrical portion 21b along an outer circumferential surface thereof. Specifically, when the lead wire guide member 21 is cut at a section perpendicular to its axis, cross sections of the six grooves 21 c are located at vertexes of a hexagon. Further, as also seen from FIGS. 7A and 7B, each guide groove 21c is opened at its both end surfaces (on the ±α sides) in an axial direction of the lead wire guide member 21.

Specifically, each guide groove 21c includes a first groove portion 21c1 around the outer circumferential surface of the tapered portion 21a, which gradually inclines with respect to and away from the axis of the lead wire guide member 21 increasingly at the tapered portion 21A toward the −α side, and a second groove portion 21c2 continuously formed next to the −α side end of the first groove portion 21c1 while extending in parallel to the α-axis on the outer circumferential surface of the cylindrical portion 21b. An inclination angle of the first groove portion 21c1 against the axis of the lead wire guide member 21 is not limited, but is preferably from about 10° to about 60°.

As seen in FIGS. 7A and 7C, a shape of a cross section of each guide groove 21c perpendicular to its lengthwise direction (i.e., an extending direction) is almost an arc. A curvature of the arc is larger than a radius of the lead wire R. A depth of the guide grooves 21c is the same for each guide groove and is substantially the same or slightly larger than a diameter of the lead wire R.

As shown in FIG. 7A, the minimum diameter of the tapered portion 21a is slightly smaller by some degree than that of the lead wire circle RC, whereas the maximum diameter of the tapered portion 21a (i.e., a diameter of the cylindrical portion 21b) is substantially the same or slightly larger than a diameter L of the lead wire insertion hole 10a (10b) as shown in FIG. 5.

Further, as shown in FIGS. 5 and 7C, on a surface of each guide groove 21c of the cylinder portion 21b (i.e., a surface defining the second guide groove portion 21c2), a long slender conductive member 22 made of metal or the like having an arc-shaped cross-section is attached.

Hence, as shown in FIG. 5, the lead wire guide member 21 thus composed is coaxially inserted into the lead wire insertion hole 10a (10b) with its tapered portion 21A facing the side wall 9 of the optical housing OH (i.e., to the +α side). In this situation, the +α side end of the lead wire guide member 21 (i.e., the minimum diameter section of the tapered portion 21a) is located on the +α side than that of the circuit board 10, whereas, the −α side end of the lead wire guide member 21 (i.e., the cylinder portion 21b) is located on the same plane as the −α side of the circuit board 10.

As a result, a base end R1 of each lead wire R (the closest portion to the stem S) projecting from a stem plane (see the two dot chain line in FIG. 5) extends parallel to the axis of the stem S, the middle R2 thereof is inserted in the guide groove 21c, and the tip R3 protrudes from the lead wire insertion hole 10a on the −α side.

Specifically, each of the six lead wires R of each one-dimensional laser array LA is pressed by at least one of the lead wire guide member 21 and the lead wire insertion hole 10a (10b), and elastically deforms along the corresponding guide groove 21c. More specifically, the middle portion R2 of each lead wire R is pressed by the tapered portion 21a between the minimum and the maximum diameter sections of the taper 21a, and gradually tilts away from the axis of the lead wire guide member 21. In other words, the middle portion R2 of each lead wire R gradually approaches an inner periphery of the lead wire insertion hole 10a (10b) of the circuit board 10, and is sandwiched by the conductive member 22 and the corresponding terminal 29 while extending in parallel to the α-axis thereof from the Maximum diameter section of the tapered portion 21a to the bottom side of the cylinder portion 21b on the −α side.

Figure 8A:
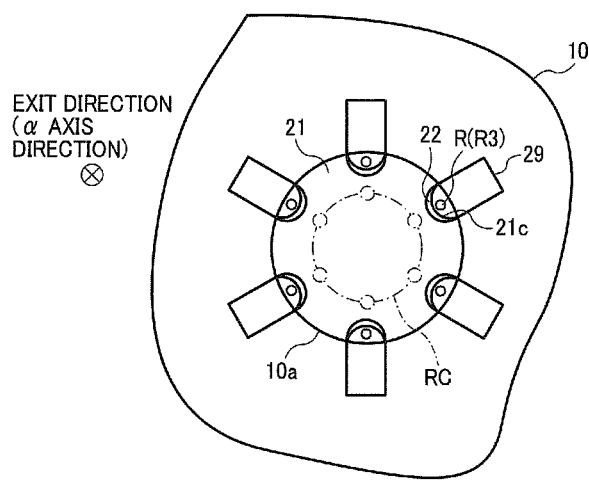
FIG. 8A is a diagram illustrating an aspect of six lead wires of the one-dimensional laser array when inserted in the six guiding grooves formed on the lead wire guide member, respectively.
Figure 8B:
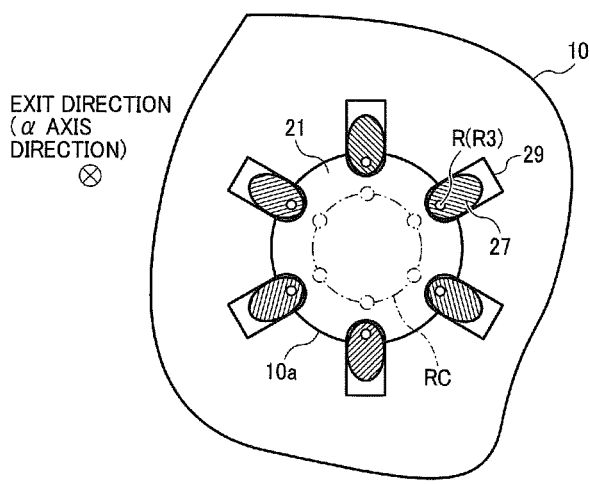
FIG. 8B is a diagram illustrating an aspect of the six lead wires of the one-dimensional laser array when soldered onto terminals of the circuit board.

As shown in FIG. 8A, the tip R3 of each of the six lead wires R respectively inserted into the six guide grooves 21c in the vicinity of the conductive member 22 and the corresponding terminal 29 protrudes from the lead wire insertion hole 10a on the −α side. Subsequently, as shown in the FIG. 8B, the tip R3 of each lead wire R is connected to both the conductive member 22 and the corresponding terminal 29 by soldering (with solder 27). Here, the six terminals 29 are arranged at prescribed positions of the inner surface of the lead wire insertion hole 10a (10b) to face the respective six lead wires R of the one-dimensional laser array LA when adjusted in a direction of the axis of the stem S.

Now, an exemplary manner of assembling the light source device 100a is described with reference to FIGS. 9A to 11. This assembly is manually achieved by an operator, for example. Specifically, as shown in FIG. 9A, first of all, the operator inserts the six lead wires R into the corresponding stepped opening 9a formed in the sidewall 9 of the in the optical housing OH with pressure with the pair of one-dimensional laser arrays LA1 and LA2 being respectively positioned around their axes directing the six lead wires R to the −α side. The insertion is thus executed while keeping an interval of the four laser diodes LD in the sub-scanning direction as designated. In this situation, the stems S of these two one-dimensional laser arrays LA collide with steps formed in the corresponding stepped openings 9a, so that the surfaces of the stems S are located on the same plane. Here, the pressing of these two one-dimensional laser arrays LA against the stepped openings 9a can be executed at the same time or one after the other.

Subsequently, the operator disposes the circuit board 10 to face the side wall 9 of the optical housing OH. The operator then adjusts a relative position of the six lead wires R of the one-dimensional laser array LA and the corresponding lead wire insertion hole 10a (10b), relatively moves at least one of the sidewall 9 and the circuit board 10 in a direction to approach with each other, and inserts the six lead wires R into the lead wire insertion hole 10a (10b) as a lead wire insertion process in step S1 of FIG. 11.

The operator subsequently inserts the four bolts 25 into the bolt insertion holes 10c formed at the four corners of the circuit board 10 and screws with corresponding female screw holes 9b (see FIG. 9B). Hence, the circuit board 10 is fixed and engages the four convex portions 23 formed on the sidewall 9 of the optical housing OH (see FIG. 5).

Figure 9C:
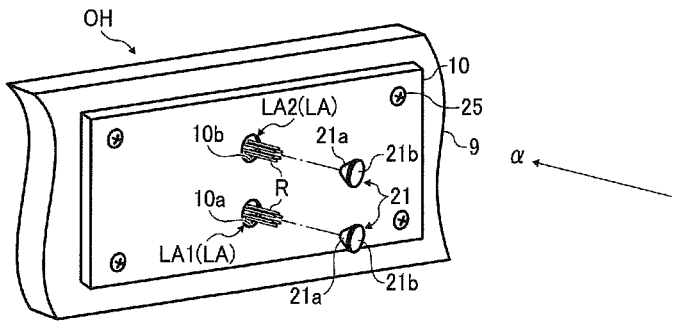
Figure 10A:
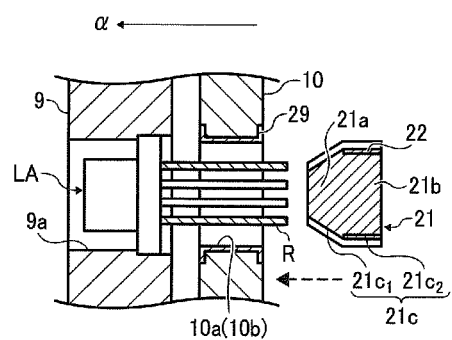
FIGS. 10A to 10F are diagrams collectively illustrating a behavior when the six lead wires are guided toward the corresponding terminals using the lead wire guide member.
Figure 10B:
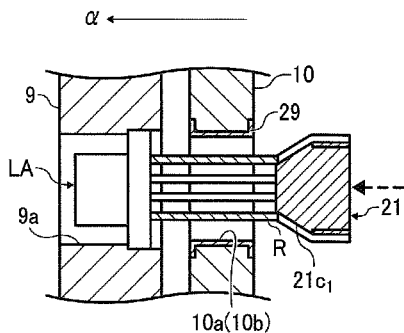

The operator then holds the lead wire guide member 21, for instance, with bare hands or a tool, such as tweezers, etc., and moves it directing the minimum diameter section of the tapered portion 21a toward the +α side to approximate the six lead wires R while adjusting a position around its axis so that the positions of the six guide groove 21c match the positions of the corresponding lead wires R (see FIGS. 9C and 10A). Then, as shown in FIG. 10B, the operator strikes the tips of the six lead wires R with the surfaces of the first groove portions 21c1 of the six guide grooves 21c of the lead wire guide member 21, respectively, as a lead wire guide striking process (in step S2 in FIG. 11).

Figure 10C:
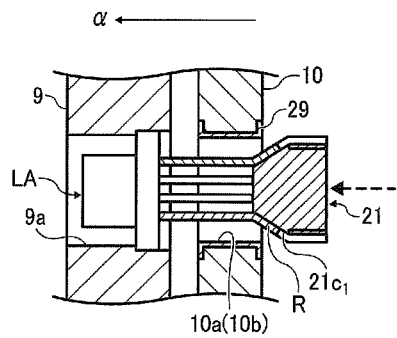

Then, the operator moves it to the +α side and inserts the lead wire guide member 21 into the lead wire insertion hole 10a (10b) while inserting the six lead wires R into the first groove portions 21c1 of the corresponding guide grooves 21c, respectively. At this moment, as shown in FIG. 10C, the tips of the six lead wires R enter and are guided along the corresponding first groove portions 21c1 as a first guiding process (in step S3 of FIG. 11). Specifically, during the first guiding process, the tips of the six lead wires R are gradually bent in a direction approaching the inner surface section of the lead wire insertion hole 10a (10b) in the circuit board 10 to separate from the axis of the lead wire guide member 21.

Figure 10D:
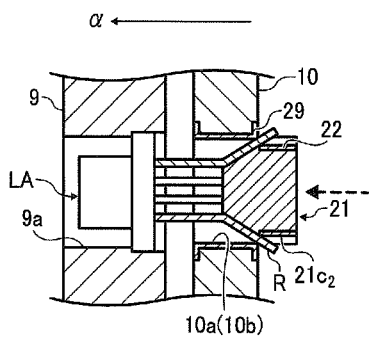
Figure 10E:
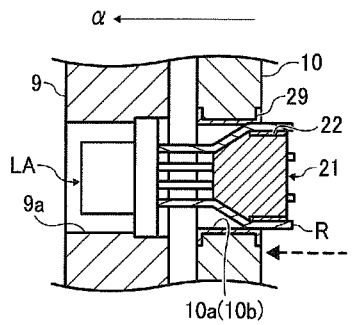

When the lead wire guide member 21 is further inserted into the lead wire insertion hole 10a, and the maximum diameter section of the taper 21a (i.e., the cylinder portion 21b) approaches the lead wire insertion hole 10a, the six lead wires R contact the inner surface section of the lead wire insertion hole 10a (10b) of the circuit board 10 on the −α side (see FIG. 10D).

Further, when the lead wire guide member 21 is further inserted (injected) into the lead wire insertion hole 10a (10b) from this state, tips of the six lead wires R are sandwiched between the conductive members 22 and the corresponding terminals 29, i.e., inserted in the second groove portion 21c2 of the corresponding guide grooves 21c, and are moderately curved. The tips of the six lead wires R are subsequently guided in a direction (i.e., the α-axis direction), in which the lead wire insertion hole 10a (10b) extends, along the corresponding second groove portions 21c2 and further advance in the −α direction in the second groove portion 21c2 as a second guide process (in step S4 in FIG. 11). The middle portions of the six lead wires R are guided along the corresponding first groove portions 21c1, and are accordingly gradually bent in a direction to separate from the axis of the lead wire guide member 21 (i.e., a direction to approach the inner surface section of the lead wire insertion hole 10A (10b) of the circuit board 10), and advance along the corresponding first groove portions 21c1, respectively (see FIG. 10E).

Figure 10F:
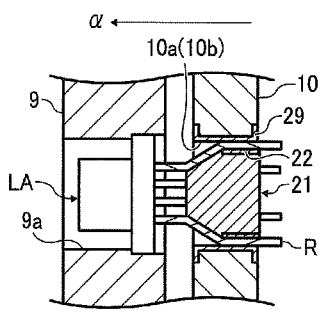
Figure 11:
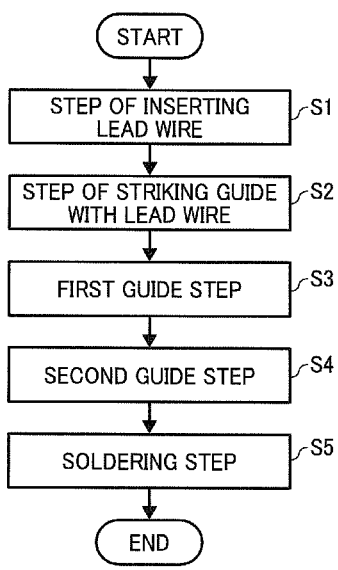
FIG. 11 is a flowchart illustrating a sequence of assembling the light source device.

When the −α side ends of the lead wire guide member 21 is located on the same plane as the −α side of the circuit board 10, the above-described insertion (injection) of the lead wire guide member 21 into the lead wire insertion hole 10a is terminated. At that moment, the six lead wires R are sandwiched by the conductive members 22 and the corresponding terminals 29 while the tips thereof protrude on the −α side from the lead wire insertion hole 10A (10b) as shown in FIG. 10F.

The insertion of the lead wire guide members 21 into the corresponding lead wire insertion holes 10a (10b) may be executed all at the same time or one after another. Further, the insertion of the lead wire guide members 21 is executed while adjusting a position of the lead wire guide member 21 around its axis to enable the six conductive members 22 attached to the lead wire guide sections 21 to face the corresponding terminals 29, respectively. Specifically, during the process of inserting the lead wire guide member 21 into the lead wire insertion hole 10a (10b), the six lead wires R and the six conductive members 22 are positioned adjacent to the corresponding terminals 29 by precisely adjusting a position of the lead wire guide member 21 around its axis. Subsequently, as shown in FIG. 5, each lead wire R, the corresponding terminal 29, and the corresponding conductive member 22 are connected to each other, for example, by soldering (with solder 27) as a soldering process (in step S5 in FIG. 11), thereby completing assembly of the light source device 100a (100b).

Hence, according to one embodiment of the present invention, by using the method of assembling the light source device 100a (100b), the multiple (e.g., six) lead wires R are inserted into the lead wire insertion hole 10a (10b) formed in the circuit board 10 all at once from the +α side thereof as described heretofore. Then, against the tips of the multiple lead wire R, the surface of the first groove portions 21c1 in the multiple (e.g., six) guide grooves 21c formed on the outer circumference of the lead wire guide member 21 as a jig are respectively contacted, respectively. Then, the lead wire guide member 21 is moved from the −α side to the +α side of the circuit board 10 (i.e., in the +α direction), so that the multiple lead wires R are guided toward the corresponding terminals 29, respectively.

At that time, simply by moving the lead wire guide member 21 in the +α direction with multiple lead wires R being inserted separately into the multiple guide grooves 21c, all of the multiple lead wires R can be lead to the corresponding terminals 29 on the lead wire insertion hole 10a (10b) at once. Specifically, the multiple lead wires R can be easily and quickly lead to the corresponding terminals 29, respectively.

Thus, when compared with a conventional system in which multiple lead wires of a light emitting element are respectively lead to the corresponding terminals on the circuit board, for example, the above-described embodiment enables the light-emitting element to be mounted onto the circuit board quickly, easily, and precisely.

As a result, productivity of a light source 100a (100b), an optical scanning device 2010 provided with a pair of light source devices 100a and 100b, and a color printer 2000 provided with the optical scanning device 2010 can be improved.

Further, the multiple lead wires R can be lead to the corresponding terminals 29 without damaging thereof keeping its quality different from a traditional method. The damage on the lead wire includes destruction thereof by static electricity caused when the lead wires are retained by a jig, such as tweezers, etc.

Further, the lead wire guide member 21 is moved in the +α direction with the multiple lead wires R being inserted into the corresponding the first groove portions 21c1, respectively. At that time, since these are guided along the corresponding first groove portions 21c1, the multiple lead wires R are smoothly and precisely guided to the corresponding terminals 29, respectively.

Further, the lead wire guide member 21 is further moved to the +α direction with the multiple lead wires R being inserted into the corresponding the first groove portions 21c1, respectively. At this moment, the lead wire guide member 21 is injected into the lead wire insertion hole 10a (10b), the tips of the multiple lead wires R are sandwiched and gradually bent by the corresponding terminals 29 and the conductive member 22, and are then inserted into the second groove portion 21c2.

The multiple lead wires R inserted into the second groove portion 21c2 are forwarded being guided therein by the second groove portions 21c2, respectively.

The lead wire guide member 21 stops its movement in the +α direction when the end surface of the −α side of the lead wire guide member 21 is located on the same plane as the −α side end of the circuit board 10.

As a result, the middle portions of the multiple lead wires R are sandwiched by the conductive members 22 and the corresponding terminals 29, respectively, and tips of those protrude from the lead wire insertion hole 10a (10b) on the −α side.

At that time, since the lead wire guide member 21 is injected into the leading wire insertion hole 10a (10b) and is almost fixed onto the circuit board 10, each lead wire R is certainly positioned at the corresponding terminal 29, and accordingly, positional deviation thereof is almost prevented.

Further, since the multiple lead wires R, the corresponding terminals 29, and the conductive members 22 are soldered in the above-described positional relation, sufficient rigidity can be obtained. Accordingly, electrical connections between the multiple lead wires R, the corresponding terminals 29, and the conductive members 22 are ensured.

By contrast, since each lead wire is incompletely pressed against the circuit board not tightly contacting thereto and is soldered with a stress therein in the conventional system as described in JP-2006-72136-A, sufficient strength of soldering is not obtained. As a result, failure contact may occur between the lead wires and the circuit board.

Further, the multiple lead wires R are located on the lead wire circle RC having a very small radius (e.g., from about 2 mm to about 3 mm). However, the multiple (e.g., six) lead wires R are guided to the corresponding terminals 29 being expanded (i.e., an interval between the lead wires P is expanded) by the lead wire guide member 21 in one embodiment of the present invention. Thus, when compared with a system in that multiple lead wires R are guided to corresponding terminals either keeping an interval between the lead wires P constant or narrowing thereof, short circuitry possibly occurring between lead wires can be prevented even when these are soldered onto the circuit board. In other words, workability can be improved again when the lead wires are soldered onto the circuit board according to one embodiment of the present invention.

Further, the light source 100a (100b) of this embodiment includes the one-dimensional laser array LA (e.g., a light emitting element) having multiple (e.g., six) lead wires R, the circuit board 10 having the lead wire insertion hole 10a (10b) receiving the multiple (e.g., six) lead wires R in a block, the multiple terminals 29 arranged on the inner surface section of the lead wire insertion hole 10a (10b) to be separately connected by the multiple lead wires R, and the lead wire guide member 21 inserted into the lead wire insertion hole 10a (10b) to press the multiple lead wire R against the corresponding terminals 29.

In such a situation, the multiple lead wires R connected to the corresponding terminals 29 are always pressed thereagainst by the lead wire guide member 21.

As a result, when compared with a situation in which the multiple lead wires R are not pressed against the corresponding terminals 29, one embodiment of the present invention can keep better electrical contact between the corresponding terminals 29 and the lead wires R, respectively.

Further, even if the soldering the lead wires R and the terminals 29 together is inadequate, and accordingly the lead wire R tends to deviate from the terminal 29, the lead wire R is substantially suppressed to depart from the terminal 29. Therefore, the soldering can be quickly and easily executed again without guiding the lead wire R to the corresponding terminal 29. Further, even if it departs from the terminal 29, the lead wire R does not contact the other lead wire R, so that short circuitry can substantially be prevented between the lead wires R.

By contrast, when the multiple lead wires R are not pressed against the terminal 29, and accordingly the soldering the lead wire R and the terminal 29 together is inadequate, the lead wire R separates from the terminal 29 and returns to its original position (i.e., a linear state) due to its elasticity. Accordingly, the lead wire R needs to be guided again to the corresponding terminal 29, and as a result, the follow up soldering cannot be quick and easy. Further, when the lead wire R deviates from the terminal 29 in the similar situation, the lead wire R contacts the other lead wire R, and short circuitry may likely occur between the lead wires R.

Further, the lead wire guide member 21 includes the multiple first groove portions 21c1 on its outer periphery to receive the respective of the multiple lead wires R inserted respectively in such a manner that the more tip side of the corresponding lead wire R more approaches the peripheral edge of the lead wire insertion hole 10a (10b). In such a situation, the multiple lead wires R can be held respectively at positions close to the corresponding terminals 29 being bent toward the corresponding terminals 29, respectively. Moreover, since each lead wire R is gradually bent, a burden on the lead wire R is negligible.

In addition, the multiple second groove portions 21c2 are formed extending in parallel to an extending direction of the lead wire insertion hole 10a (10b) (i.e., the α-axis direction) being continuously connected respectively to the multiple first groove portions 21c1 on the tip side thereof, respectively, on the outer periphery of the lead wire guide member 21. Thus, the multiple lead wire R extending from the tip to the middle portion thereof is pressed against the corresponding terminal 29 to be parallel to the extending direction of the lead wire insertion hole 10a (10b). Therefore, electrical contact between the corresponding terminal 29 and the lead wire R can be kept more adequately.

Further, since the lead wire guide member 21 is injected into the lead wire insertion hole 10a (10b) and is held on the circuit board 10, a private use securing device is not needed.

Further, since the lead wire R, the terminal 29, and the conductive member 22 are soldered together collectively sandwiching the lead wire R, the soldering can be harder when compared with only soldering the lead wire R and the corresponding terminal 29 together. As a result, electrical connection between the lead wire R and the corresponding terminal 29 can be stable.

Further, because the end surface (i.e., the −α side end) of the lead wire guide member 21 on the tip side of the lead wires R is located on the same plane as the side end (i.e., the −α side end) of the circuit board 10 on the tip side of the lead wires R, the lead wire R, the corresponding terminal 29, and the conductive member 22 can be more easily and reliably soldered together when compared with soldering those on a stepped plane at both side ends.

Now, the second embodiment of the assembly method according to the present invention another is described with reference to FIG. 12 and applicable drawings. Since a color printer of the second embodiment has substantially the same configuration as that of the first embodiment except for a light source device, only the light source is described.

Figure 12:
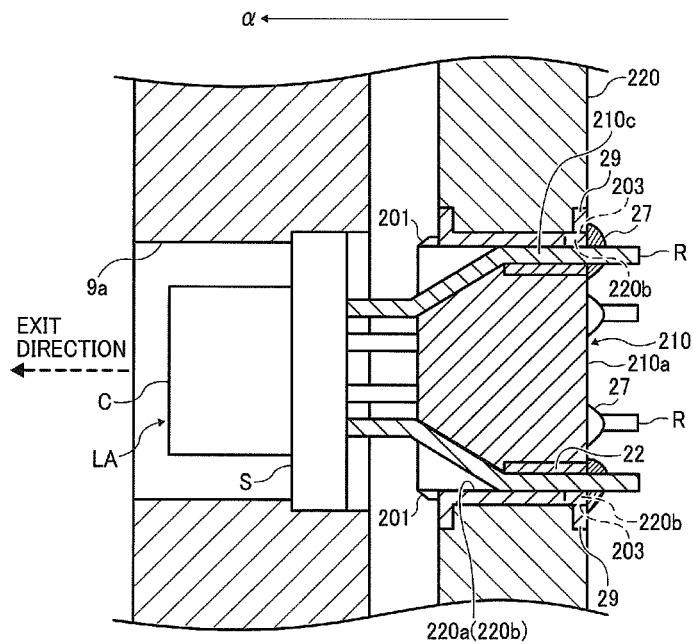
FIG. 12 is a partial cross-sectional view of the light source device according to a second embodiment of the present invention.

In the second embodiment, as shown in FIG. 12, a shape of the lead wire guide member 210 of the light source device is different from that of the first embodiment.

The lead wire guide member 210 of the second embodiment has a guide member main body 210a mainly consisting of almost a cylinder, multiple hooking claws 201 radially projecting from the outer surface of the guide member main body 210a, and a stopper 203.

Figure 13A:
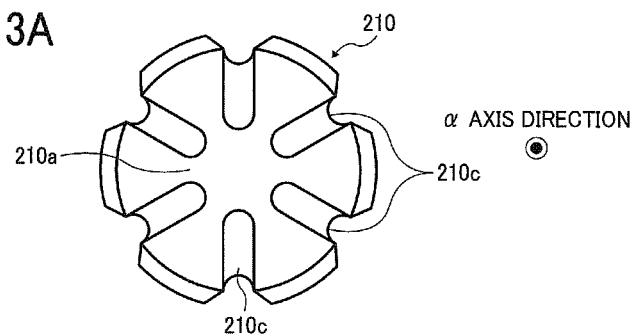
FIG. 13A is a front side view of the lead wire guide member shown in FIG. 12.
Figure 13B:
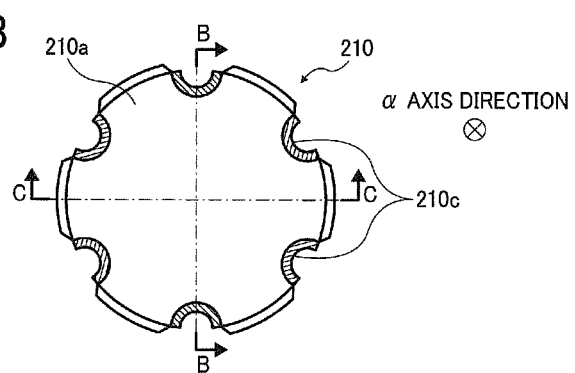
FIG. 13B is a rear view of the lead wire guide member shown in FIG. 12.

As seen from FIGS. 13A and 13B, six guide grooves 210c are similarly formed on the guide member main body 210a radially extending from its outer surface as in the first embodiment. Specifically, the guide member main body 210a has a whole shape formed by scraping portions off the cylinder corresponding to the six guide grooves 210c.

Figure 14A:
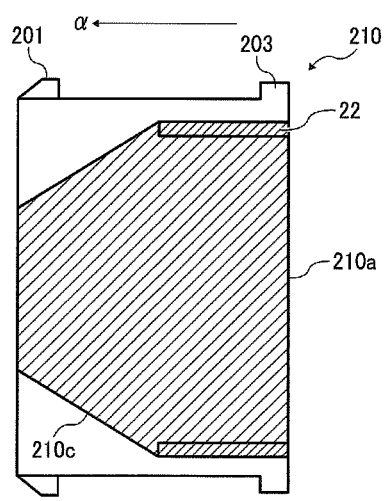
FIG. 14A is a cross-sectional view of the lead wire guide member along a line B-B in FIG. 13B.
Figure 14B:
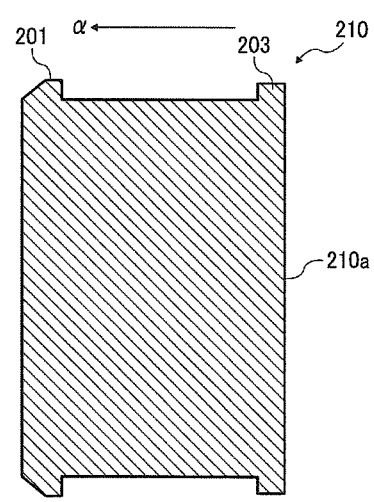
FIG. 14B is a cross-sectional view along a line C-C in FIG. 13B.

In other words, as shown in FIG. 14A, the guide member main body 210a has a shape obtained by combining an isosceles trapezoid and a rectangle at their long sides at a cross section across both the opposed guide grooves 210c formed thereon and its axis. Further, as shown in FIG. 14B, the guide member main body 210a has almost a rectangular shape at a section across both middle points between two neighboring guide grooves 210c and its axis.

A diameter of the guide member main body 210a is slightly smaller than that of the lead wire insertion hole 220a.

Further, as shown in FIGS. 13A to 14B, the hooking claws 201 are located on a circumferential surface between two adjacent guide grooves 210c at an end of the +α side of the guide member main body 210a. That is, totally six hooking claws 201 are formed to line up on the guide member main body 210a at the same interval in a circumferential direction thereof. The more −α side end of the hooking claw 201 inclines more to depart from the guide member main body 210a, and a most −α side end is perpendicular to the a axis. The +α side end of the hooking claw 201 is continuous from the +α side end of the guide member main body 210a.

Further, as shown in FIGS. 13A to 14B, the stoppers 203 are located at an end of the −α side of the guide member main body 210a on a circumferential surface thereof between two adjacent guide grooves 210c. That is, totally six stoppers 203 are formed to line up on the guide member main body 210a at the same interval in a circumferential direction thereof. Both the ±α side ends are perpendicular to the α-axis. The −α side end of the stopper 203 is located on the same plane as the −α side end of the guide member main body 210a.

Further, as shown in FIG. 12, six stopper holes 220b are formed on an inner surface of the lead wire insertion hole 220a formed on the −α side surface of the circuit board 220 to receive the six stoppers 203, respectively. A depth of the stopper insertion hole 220b is equivalent to a length of the stopper 203 in the α-axis direction.

Hence, as shown FIG. 12, the −α side surface of the six hooking claws 201 of the lead wire guide member 210 engages the +α side surface of the circuit board 220, and the six stoppers 203 are inserted into the corresponding stopper insertion holes 220b respectively. Hence, the lead wire guide member 210 is fixed to the circuit board 220 being inserted into the lead wire insertion hole 220a. Specifically, a securing device for securing the guide member main body 210a to the circuit board 220 is established by the six stoppers 203 and the six hooking claws 201.

Similar to the first embodiment, the tips of the six lead wires R inserted respectively into the six guide grooves 210c, respectively, the corresponding terminals 29 on the circuit board 220, and the conductive member 22 of the lead wire guide member 210 are soldered together with solder 27.

A method of assembling the light source device of the second embodiment is roughly the same as the above-described first embodiment. Specifically, the lead wire guide member 210 is inserted into the lead wire insertion hole 220a from the +α side surface thereof with the six lead wire R being inserted into the six guide channel 210c, respectively. At this time, since the more +α side of the six hooking claws 201 incline to approach the guide member main body 210a closer, the lead wire guide member 210 can be smoothly inserted into the lead wire insertion hole 220a. Further, when the six hooking claws 201 exit the lead wire insertion hole 220a and are hooked on the circuit board 220 while the six stoppers 203 are inserted into corresponding insertion holes 220b, respectively, the lead wire guide member 210 is locked by the circuit board 220. In this state, the −α side surface of the lead wire guide member 210 is located on the same plane as the −α side surface of the circuit board 220. Subsequently, the lead wires R, the corresponding terminals 29, and the conductive members 22 are soldered with solder 27, respectively.

According to the second embodiment, the multiple hooking claws 201 and the stoppers 203 each projecting radially from around the outer surface of the guide member main body 210a are separately arranged in the direction of the axis (i.e., the α-axis) of the guide member main body 210. Thus, when the lead wire guide member 210 is inserted into the lead wire insertion hole 220a, the circuit board 220 is held by the multiple hooking claws 201 and multiple stopper stoppers 203.

That is, without using a tool or the like, the lead wire guide member 210 can be fixed to the circuit board 220. As a result, each lead wire R, a corresponding terminal 29, and a conductive member 22 can be soldered together with the lead wires R being respectively positioned regarding the corresponding terminals 29.

This invention is not limited to the above-described various embodiments, and various modifications can be employed. For example, the guide grooves are formed on the circumference of the lead wire guide member in the above described embodiments. However, the guide grooves can be omitted. That is, multiple inclined or curved surfaces may be formed on a tapered portion of the lead wire guide member respectively corresponding to the multiple lead wires, and the tips of corresponding lead wires are struck with the multiple inclined or curved surfaces by moving the lead wire guide member, so that each lead wire can be guided towards the corresponding terminal.

In the foregoing embodiments, each guide groove is continuously formed on the lead wire guide member 210. However, the present invention is not limited only to this, and each guide groove may be interrupted at at least one section thereon.

In the foregoing embodiments, the lead wire insertion hole is circular (i.e., a round hole). The present invention is not limited thereto, and alternatively may be polygonal or oval, etc., for example. In such a situation, the shape of the lead wire guide member preferably matches that of the lead wire insertion hole as in the above-described embodiments.

In the first embodiment, the conductive member 22 is attached onto each of the guide grooves 21c formed the outer periphery of the lead wire guide member 21, but can be omitted. In such a situation, after each lead wire R and the corresponding terminal 29 are soldered together, the lead wire guide member 21 can be removed from the circuit board 10. Specifically, the lead wire guide member 21 may not serve as a portion (i.e., a component) of the light source device 100a (100b).

Figure 15A:
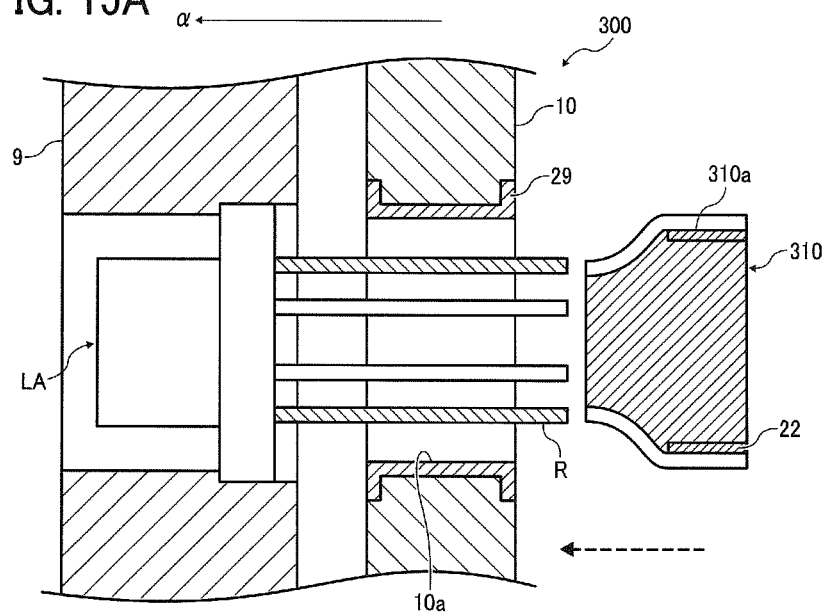
FIGS. 15A and 15B are diagrams collectively illustrating a modification of the lead wire guide member used when the six lead wires are guided toward the corresponding terminals.
Figure 15B:
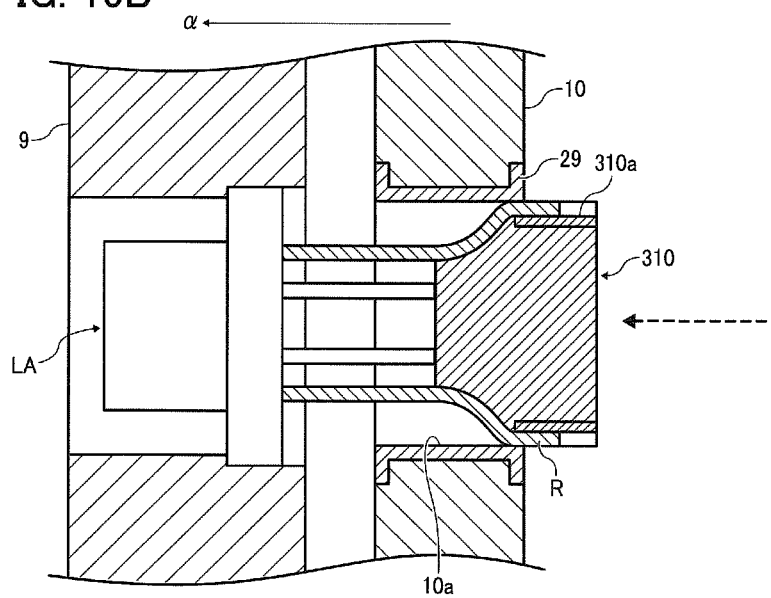

The first groove portion on the +α side of the guide groove formed on the lead wire guide member is inclined regarding the axis direction (i.e., the α-axis direction) of the lead wire guide member in the above described embodiment. However, alternatively, as shown in FIG. 15A, the groove may be moderately curved to have an inflection point at a middle portion as well (i.e., it includes a little curvature in its extending direction). In such a situation, when the lead wire R is guided along the first groove section 310a of the lead wire guide member 310, load on the lead wire R is reduced, and more smooth elastic deformation can be obtained (see FIG. 15B). Furthermore, the first groove portion 310a is preferable if including at least one curvature portion omitting the inflection point at the middle. Further, the at least one curvature can protrude in a direction to approach or is distanced from the axis of the lead wire guide member.

In the above-described first embodiment, the lead wire guide member 21 is injected into the lead wire insertion hole 10a formed in the circuit board 10. However, alternatively, or in addition to this, a portion of the lead wire guide member 21 other than the conductive member 22 may be connected to the circuit board 10 with adhesive, for example. Specifically, a collar radially protruding from the lead wire guide member is established on the surface thereof at its −α side, and can be bonded to the surface of the −α side of the circuit board with glue.

Otherwise, when the lead wire guide member 21 is injected into the lead wire insertion hole 10a formed in the circuit board 10, at least one of the circuit board and the lead wire guide member can employ a similar securing device as in the above-described second embodiment.

Further, in the above-described second embodiment, the securing device for securing the lead wire guide member 210 and the circuit board 220 is constituted by the six stoppers 203 and the six hooking claws 201. However, the present invention is not limited thereto. For example, the securing device may be included in at least one of the circuit board and the lead wire guide member. Specifically, every securing device is employable if including a device to secure the lead wire guide member inserted into the lead wire insertion hole to the circuit board.

Further, in the above described embodiments, each of the terminals 29 is the U-shape and is attached onto the inner surface of the lead wire insertion hole of the circuit board almost pinching the circuit board. However, the present invention is not limited thereto. Specifically, each terminal can includes a flat member and is only attached to the surface of the −α side of the circuit board or the surface defining the lead wire insertion hole. Otherwise, each terminal can include an L-shaped member, and is attached to a surface of −α or +α side of the circuit board, and a surface defining the lead wire insertion hole.

Further, the number of light source devices included in the optical scanning device, the number of one-dimensional laser arrays included in the light source, the number of laser diodes included in the one-dimensional laser arrays, the number of lead wires included in the laser diode can be appropriately changed depending on various circumstances. Specifically, the optical scanning device is good if having at least one light source device. One or all light source devices are good if each having at least one one-dimensional laser array. One or all one-dimensional laser arrays are good if each having at least one laser diode. One or all laser diodes are good if each having multiple lead wires. Here, on the outer circumference of the lead wire guide member, at least the same numbers of the guide grooves need to be formed as the lead wires.

The light source device of the foregoing embodiments has multiple one-dimensional laser arrays each including several one-dimensionally aligned laser diodes. However, the present invention is not limited thereto. Specifically, instead of the above described system, the light source device is good if having at least one two-dimensional laser array that contains multiple two-dimensionally aligned laser diodes, for example.

Further, in the above-described embodiment, the multiple lead wires R (e.g., six pieces) of each of the one-dimensional laser arrays respectively extend perpendicular to the stem plane. However, the present invention is not limited to just this, and the multiple lead wires R may cross the stem plane. In such a situation, the multiple lead wires of each of the one-dimensional laser arrays are not necessarily parallel to each other.

Further, the multiple one-dimensional laser arrays each has multiple surface-emitting type lasers as described in the foregoing embodiments. However, the present invention is not limited to thereto, and instead, at least one surface emitting type laser may be included.

Further, in each light source device of the above-described embodiments, the circuit board and the pair of one-dimensional laser arrays are directly attached to the optical housing OH. However, the present invention is not limited thereto, and the circuit board and the pair of one-dimensional laser arrays can be held by a holder and indirectly attached to the optical housing OH.

Only the opening (i.e., an entrance of each lead wire R) of the guide groove formed on the circumference of the lead wire guide member on the +α side can be somewhat larger than other's. With this, the lead wire R can be easily inserted into the corresponding guide groove.

Further, in the above-described second embodiment, only guide grooves need to be formed on the lead wire guide member such that the more −α side guide groove inclining with respect to the axis of the lead wire guide can more separate from the axis of the lead wire guide. Further, it is good that the inclined groove is opened both on the ±α side ends of the lead wire guide member. In such a situation, each lead wire R diagonally protrudes on the −α side of the lead insertion hole.

Further, in the foregoing embodiments, the optical scanning device 2010 has four one-dimensional laser arrays and four optical systems corresponding to the four photoconductive drums. However, the present invention is not limited thereto, and it is good that a single light source device containing one or more one-dimensional lasers, and a single light flux separation device, such as a beam splitter, etc., that separates a light flux emitted from the one or more one-dimensional laser arrays into two light fluxes can be employed. That is, four optical systems may be employed to separately correspond to the four photoconductive drums.

A color printer is used as the image forming apparatus in the foregoing embodiments. However, the present invention is not limited thereto, and a monochrome printer can be adopted. In such a situation, the image forming apparatus is good to employ only a single photoconductive drum and a single optical system for scanning a scanning plane of the single photoconductive drum.

Further, the printer is used as the image forming apparatus in the foregoing embodiments.

According to an assembly method of the present invention, mounting of the light-emitting element onto the circuit board can be improved.

Numerous additional modifications and variations of the present invention are possible in light of the above teachings. It is therefore to be understood that within the scope of the appended claims, the present invention may be practiced otherwise than as specifically described herein.

What is claimed is:

1. A method of assembling a light source, comprising the steps of:
   inserting multiple lead wires of a light emitting element into an insertion hole formed in a circuit board from a first side of the circuit board at once;
   striking tips of the multiple lead wires with corresponding multiple guides formed on a circumference of a pressing device from a second side of the circuit board opposite the first side;
   moving the pressing device toward the first side from the second side of the circuit board; and
   in a first stage, guiding the multiple lead wires to corresponding terminals formed on an inner wall of the insertion hole of the circuit board, respectively.

2. The method as claimed in claim 1, wherein each of the multiple guides formed on the circumference of the pressing device has a first groove increasingly approaching the inner wall of the insertion hole toward the second side of the circuit board, and wherein the step of guiding the multiple lead wires in the first stage is executed using the first groove.

3. The method as claimed in claim 2, wherein each of the multiple guides formed on the circumference of the pressing device has a second groove continuously extending from one end of the first groove in a direction in which the insertion hole extends, the method further comprising the steps of:
   in a second stage, moving the pressing device toward the first side from the second side of the circuit board after the first stage; and
   guiding the multiple lead wires along the corresponding second grooves, respectively.

4. The method as claimed in claim 3, wherein a cross section of the pressing device perpendicular to a direction in that the pressing device is inserted into the insertion hole is larger than the insertion hole.

5. The method as claimed in claim 3, wherein at least one of the pressing device and the circuit board has a securing device to secure the pressing device to the circuit board, the method further comprising the step of:
   securing the pressing device to the circuit board using the securing device during the second stage.

6. The method as claimed in claim 3, wherein during the second stage the pressing device is moved until one side of the pressing device is located on the same plane as the other side of the circuit board.

7. The method as claimed in claim 3, further comprising the step of soldering the respective multiple lead wires and the corresponding terminals together after the second stage.

8. The method as claimed in claim 3, wherein the pressing device has electrical insulation properties and the grooves include conductive members having electrical conductivity, respectively, the method further comprising the step of:
   soldering the respective multiple lead wires, the corresponding terminals, and the conductive members together after the second stage.

9. An optical scanning device comprising:
   a light source assembled by using the assembly method as claimed in claim 1; and
   an optical scanning unit to scan a scanning object with light emitted from the light source.

10. The optical scanning device as claimed in claim 9, wherein each of the multiple guides formed on the circumference of the pressing device has a first groove increasingly approaching the inner wall of the insertion hole toward the second side of the circuit board, and wherein the step of guiding the multiple lead wires in the first stage is executed using the first groove.

11. The optical scanning device as claimed in claim 10,
wherein each of the multiple guides formed on the circumference of the pressing device has a second groove continuously extending from one end of the first groove in a direction in which the insertion hole extends,
wherein, in a second stage, the pressing device is moved toward the first side from the second side of the circuit board after the first stage, while the multiple lead wires are guided along the corresponding second grooves, respectively.

12. The optical scanning device as claimed in claim 11, wherein a cross section of the pressing device perpendicular to a direction in that the pressing device is inserted into the insertion hole is larger than the insertion hole.

13. The optical scanning device as claimed in claim 11,
wherein at least one of the pressing device and the circuit board has a securing device to secure the pressing device to the circuit board,
wherein the pressing device is secured to the circuit board using the securing device during the second stage.

14. The optical scanning device as claimed in claim 11, wherein the pressing device is moved until one side of the pressing device is located on the same plane as the other side of the circuit board during the second stage.

15. The optical scanning device as claimed in claim 11, wherein the respective multiple lead wires and the corresponding terminals are soldered together after the second stage.

16. The optical scanning device as claimed in claim 11,
wherein the pressing device has electrical insulation properties and the grooves include conductive members having electrical conductivity, respectively,
wherein the respective multiple lead wires, the corresponding terminals, and the conductive members are soldered together after the second stage.

17. An image forming apparatus, comprising:
an image bearer; and
an optical scanning device including:
a light source assembled by using the assembly method as claimed in claim 1; and
an optical scanning unit to scan a scanning object with light emitted from the light source.

18. The image forming apparatus as claimed in claim 17, wherein each of the multiple guides formed on the circumference of the pressing device has a first groove increasingly approaching the inner wall of the insertion hole toward the second side of the circuit board, and wherein the step of guiding the multiple lead wires in the first stage is executed using the first groove.

19. The optical scanning device as claimed in claim 18,
wherein each of the multiple guides formed on the circumference of the pressing device has a second groove continuously extending from one end of the first groove in a direction in which the insertion hole extends,
wherein, in a second stage, the pressing device is moved toward the first side from the second side of the circuit board after the first stage, while the multiple lead wires are guided along the corresponding second grooves, respectively.

20. The optical scanning device as claimed in claim 19, wherein a cross section of the pressing device perpendicular to a direction in that the pressing device is inserted into the insertion hole is larger than the insertion hole.

* * * * *